(12) United States Patent
Tammela et al.

(10) Patent No.: US 7,813,608 B2
(45) Date of Patent: Oct. 12, 2010

(54) OPTICAL FIBER FABRICATION

(75) Inventors: Simo Tammela, Espoo (FI); Kalle Ylä-Jarkko, Hämeenlinna (FI)

(73) Assignee: Liekki Oy, Lohja (FI)

( * ) Notice: Subject to any disclaimer, the term of this patent is extended or adjusted under 35 U.S.C. 154(b) by 31 days.

(21) Appl. No.: 11/358,112

(22) Filed: Feb. 22, 2006

(65) Prior Publication Data

US 2007/0230881 A1 Oct. 4, 2007

(30) Foreign Application Priority Data

Feb. 23, 2005 (FI) ................................ 20050213

(51) Int. Cl.
*G02B 6/04* (2006.01)
(52) U.S. Cl. .................................................. 385/115
(58) Field of Classification Search .................. None
See application file for complete search history.

(56) References Cited

U.S. PATENT DOCUMENTS

| | | | |
|---|---|---|---|
| 3,653,739 A * | 4/1972 | Strack ......................... 385/115 |
| 4,291,940 A | 9/1981 | Kawasaki et al. |
| 4,355,863 A | 10/1982 | Aulich et al. |
| 4,720,160 A | 1/1988 | Hicks, Jr. |
| 4,815,079 A | 3/1989 | Snitzer et al. |
| 5,818,630 A | 10/1998 | Fermann et al. |
| 5,854,865 A | 12/1998 | Goldberg |
| 5,864,644 A | 1/1999 | DiGiovanni et al. |
| 5,999,673 A | 12/1999 | Valentin et al. |
| 6,370,297 B1 | 4/2002 | Hakimi et al. |
| 6,397,636 B1 | 6/2002 | DiGiovanni et al. |
| 6,434,295 B1 | 8/2002 | MacCormack et al. |
| 6,434,302 B1 | 8/2002 | Fidric et al. |
| 6,778,562 B2 | 8/2004 | Bayart et al. |
| 6,826,335 B1 | 11/2004 | Grudinin et al. |
| 7,283,695 B2 * | 10/2007 | Gaylord et al. ............... 385/14 |
| 2002/0197037 A1 * | 12/2002 | Bailey et al. ................. 385/123 |
| 2004/0052484 A1 | 3/2004 | Broeng et al. |
| 2004/0071423 A1 | 4/2004 | Libori et al. |
| 2004/0223709 A1 * | 11/2004 | Conrad et al. ............... 385/114 |
| 2006/0133746 A1 * | 6/2006 | Quinn et al. ................. 385/100 |

FOREIGN PATENT DOCUMENTS

| | | |
|---|---|---|
| CA | 2 362 992 | 8/2000 |
| CA | 2 368 778 | 10/2000 |
| EP | 0 695 003 | 1/1996 |
| FR | 2 822 242 | 9/2002 |
| JP | 55-133003 | 10/1980 |
| JP | 59-166908 | 9/1984 |
| WO | WO 96/20519 | 7/1996 |
| WO | WO 00/49435 | 8/2000 |
| WO | 03/017440 | 2/2003 |

OTHER PUBLICATIONS

European Patent Office Action, dated Jan. 5, 2009 and issued in corresponding European Patent Application No. 06 708 924.3-2216.

* cited by examiner

*Primary Examiner*—Sung H Pak
(74) *Attorney, Agent, or Firm*—Young & Thompson

(57) ABSTRACT

The invention relates to a bundle of optical fibers and a process for its preparation, wherein at least two of the optical fibers are at least partly attached to each other lengthwise by means of a removable longitudinal bridging element. Typically, the bridging element is an open one-hole capillary.

80 Claims, 8 Drawing Sheets

Figure 1 (a) and (b), Prior Art.

OPTICAL FIBER FABRICATION

FIELD OF THE INVENTION

The present invention relates to a bundle containing optical fibers and to a process for preparing such a bundle. Bundles containing optical devices are useful in fiber lasers and amplifiers, in particular when coupling light from multimode pump sources to one or more double cladding fibers including an active element in the fiber core.

BACKGROUND ART

The output powers from double-clad fiber lasers have recently increased tremendously. In recent experiments, hundreds of watts have been achieved from essentially single-mode devices making fiber lasers serious contenders for e.g. lamp and diode pumped (Nd:Glass) Nd:YAG in material processing. Apart from continuous wave operation, pulsed operation and pulse amplification with down to femtosecond range pulses and peak powers well in excess of 100 kW have also been demonstrated with fiber lasers.

Fiber lasers based on double-clad fibers offer several benefits over solid state lasers. The main performance advantage of the double-clad fiber lasers is the easier management of the thermal load within the device. The high surface to active volume ratio of such fibers ensures excellent heat dissipation. Also, the beam modal quality is largely determined by the size and refractive index profile of the active core and the surrounding materials, and is therefore independent of the pump power and the thermal load. In comparison, solid-state lasers employing bulk crystals as their gain media are known to be sensitive to such effects as thermal lensing, which have to be taken into account when designing the laser cavity. In this respect, the fibers provide a remarkably stable gain element. In addition, further benefits of fiber laser such as spatial compactness, high degree of integration, simplicity of operation, robustness and reliability of operation are driving the rapid adaptation of high power fiber lasers and fiber amplifiers into several commercial and military applications, for example, as sources for micro-machining, thermal printing, welding, marking, medical applications, and remote sensing.

Traditional double clad active fibers consist of a rare earth doped single-mode or multimode core, a silica inner cladding with a diameter of several hundred micrometers and a second low index outer cladding consisting of a low index polymer such as silicone resin. The numerical aperture (NA) between the inner and outer cladding is in the range 0.35-0.47 depending on the refractive index of the coating material. The inner cladding is used to couple pump radiation from low-brightness multimode pump sources such as high power diode lasers, diode laser bars and arrays for absorption in the active core. Typically, the overlap between the pump field and the doped core is small which requires long device lengths to absorb the majority of the pump radiation. Pump absorption in the core material can be enhanced by fiber structure design where the single-mode core is offset from the center of the circular cladding or where the circular symmetry of the inner cladding is broken.

A common problem related to double clad fiber devices is how to couple a sufficient number of low brightness sources to the inner cladding efficiently and without significantly increasing the cost of the fiber laser. The pump coupling problem is enhanced by the requirement of simultaneous coupling of the signal light into and out of the active core. Being able to separately couple pump light into the double clad fiber structure without affecting the signal coupling allows the use of bidirectionally pumped cladding-pumped fiber lasers and fiber amplifiers. The output power scaling of the bidirectionally pumped fiber laser and amplifiers is more straightforward as multiple pumping points can be added along the fiber length. Additionally, the thermal management of the bidirectionally pumped structures is simplified. However, the problem of careful and stable signal coupling into and out of the double clad fibers has become more important because of the adaptation of large-mode area (LMA) or multimode fibers in high power CW fiber lasers and short pulse fiber amplifiers. LMA fibers are required to overcome the output power (peak power for short pulse applications) limitations imposed by fiber nonlinearities. For these fibers the excitation of the fundamental mode is essential to achieve close to single-mode operation (see e.g. U.S. Pat. No. 5,818,630).

Fiber structures have been developed, which enable the coupling of pump light into the signal fiber. Most of these structures are optimized to operate at lower power levels having a single-mode core. In order to boost the output powers in the kW level, the core size of the signal fiber needs to be increased. The increase in core size is required to overcome the thermal limitations in the fiber core and to the increase the threshold for nonlinearities such as stimulated Raman scattering, stimulated Brillouin scattering and self-phase modulation. In high power fiber laser having diffraction limited output beam quality, the reduction of the microbending of the optical fiber is essential to eliminate the mode-mixing in the signal core. Also the number of splicing points need to be minimized as they are also possible points for mode mixing and they increase the background losses of the fiber (thus reducing the efficiency of the fiber laser).

Photonic Fibers

Recently, "photonic fibers" have appeared on the market, these fibers also being known as "photonic crystal fibers" (PCF) (see U.S. Pat. No. 6,778,562). Like conventional fibers, these fibers are not fully constituted by a solid transparent material, such as doped silicon. Shown as a section, a photonic fiber exhibits a plurality of air holes of another gas, even a vacuum. The only known function of the holes is the effect of inducing in the fiber large variations of the index, these variations, like the variations induced in the fiber by doping agents, contributing to guide the light in the fiber (see U.S. Pat. No. 6,778,562, FR2822242, CA2362992, WO00/49435, US2004/071423, US2004/0052484 and CA2368778).

The holes of these photonic fibers are parallel to the axis of the fiber and extend longitudinally along the fiber. In practice, these holes can be obtained by producing a preform by assembling silicon cylinders or capillary tubes according to the required pattern of the holes in the drawn fiber. Finally, stretching this preform provides a fiber with holes corresponding to the pattern of capillary tubes. Said U.S. Pat. No. 6,778,562 discloses the bundling and stretching of photonic fibers together with conventional optical fibers to give a bundle structure having photonic fibers surrounded by optical fibers. The stretching usually closes the openings of the photonic fibers.

Optical Couplers

Figure 1:
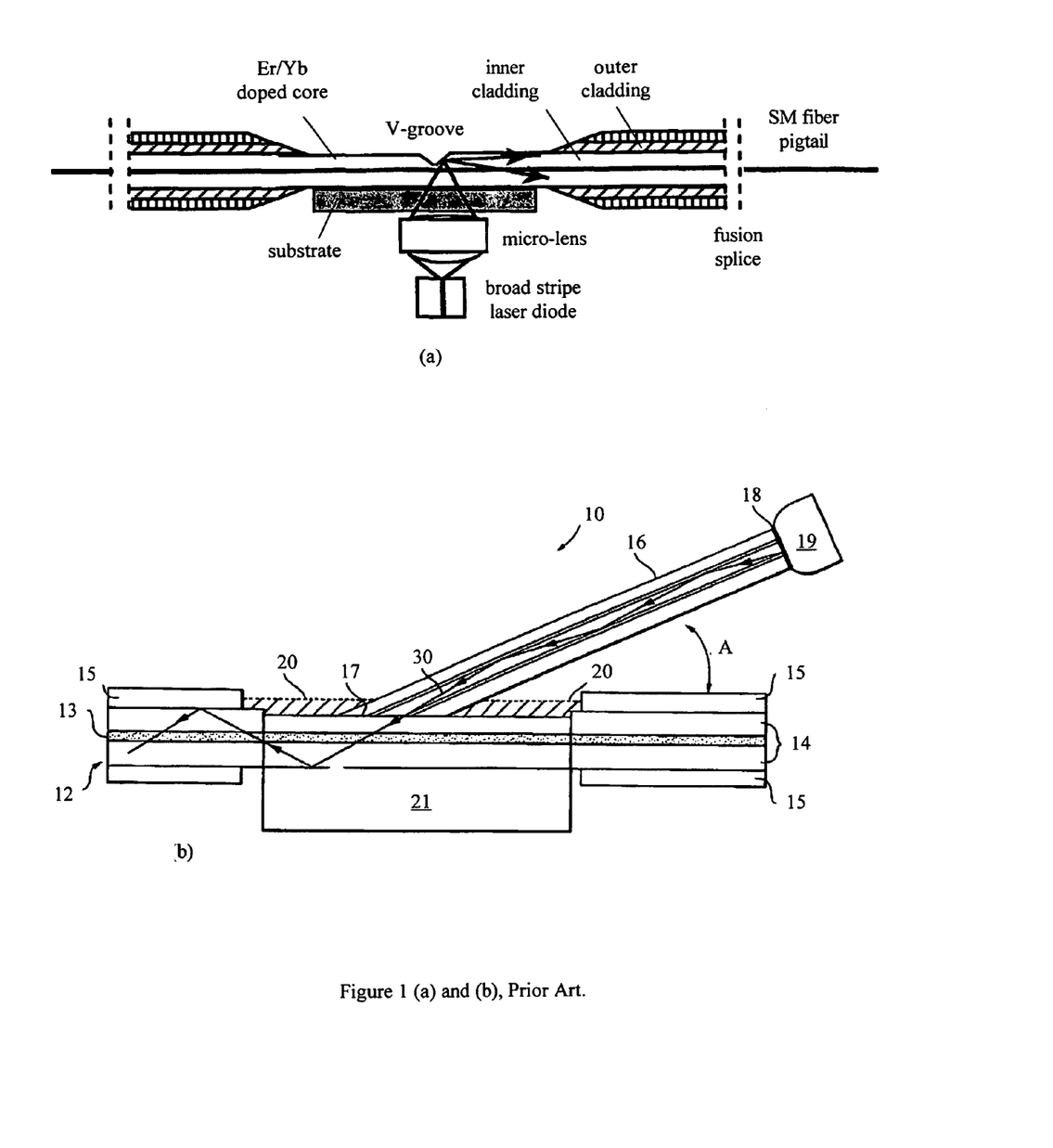

One common approach to couple the light into the fiber is to use bulk optics to couple the light directly from the low brightness source(s) or from a multimode fiber(s) into the double clad fiber. In order to have both ends of the double clad fiber free for signal coupling light can be coupled into the fiber by using a bulk prism (see U.S. Pat. No. 4,815,079) or a V-groove which is fabricated into the side of the fiber (see U.S. Pat. No. 5,854,865 or L. Goldberg and J. Koplow, High power side-pumped Er/Yb doped fiber amplifier, Technical Digest of the Optical Fiber Communication Conference (OFC), Feb. 19-21, 1999/) as is shown in FIG. 1(a). The difficulty in these approaches is matching and alignment of different components well enough to get acceptable coupling efficiencies. Bulk components can be avoided by angle polishing the end of the multimode fiber and attaching the fiber to the side of the double-clad fiber for example by soldering, UV-curing or epoxyfying (U.S. Pat. No. 6,370,297) as is shown in FIG. 1(b). Different surfaces and components, however, require also polishing, antireflection coating and maintenance of the good alignment, which further complicate the manufacturing and increase the cost of these systems.

Figure 2:
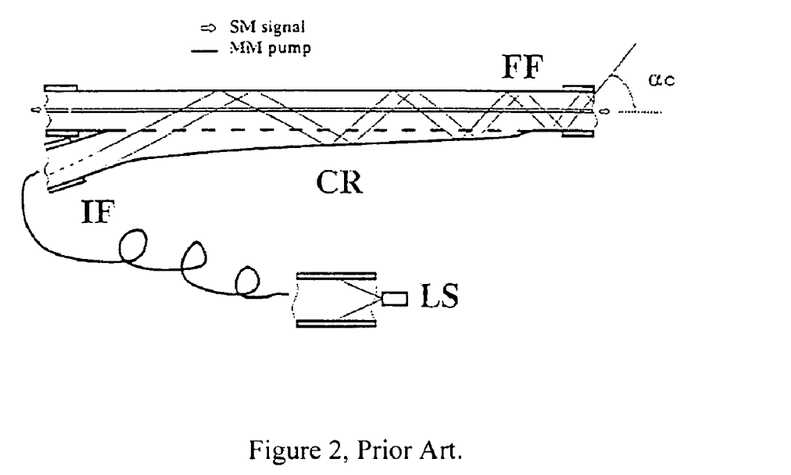
FIG. 2 (Prior Art) describes a coupling arrangement between a multi-mode light source and an optical fiber through an intermediate optical fiber length.

WO96/20519, U.S. Pat. No. 5,999,673, "A coupling arrangement between a multi-mode light source and an optical fiber through an intermediate optical fiber length" is a similar pumping arrangement to U.S. Pat. No. 6,370,297, but here the pump light is introduced to the pump cladding through an intermediate fiber length which is fused and tapered to the signal fiber as shown in FIG. 2. This reduces the probability of the thermal damage but does not solve the manufacturing difficulties.

Figure 3:
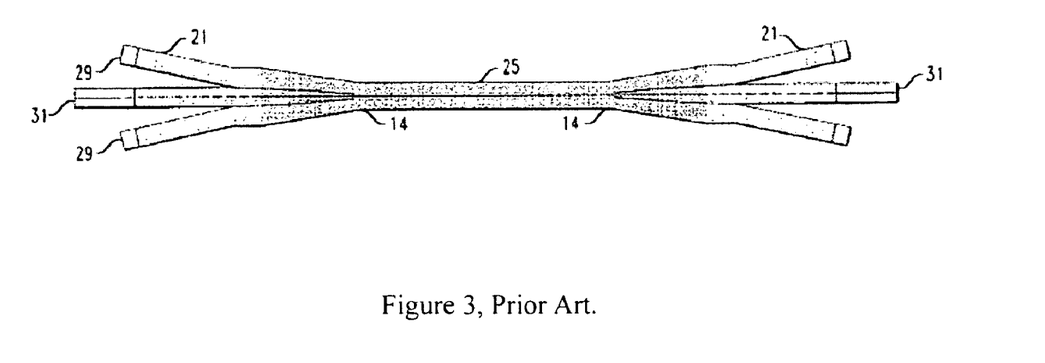
FIG. 3 (Prior Art) describes a fused multimode coupler incorporating a signal fiber in the center of the fused bundle. Coupler is further spliced to an active double clad fiber.

Another approach is to use separate components such as fused fiber bundles (U.S. Pat. Nos. 4,291,940, 5,864,644, 6,397,636, 6,434,302 and 6,778,562) or fused fiber tapers (U.S. Pat. No. 599,673), which are spliced into the double-clad fibers as shown in FIG. 3. These solutions avoid the use of any bulk optic components in the pump coupling and also do not require any antireflection coatings on the coupling surfaces as they are all-fused solutions. In these structures several multimode fibers are typically bundled together, heated and stretched to form a fused fiber bundle having a diameter smaller than the combined diameter of the fiber bundle prior to heating and stretching process. The difficulty in achieving high transmission of multimode light through the fiber bundle is to keep the fiber deformations low during the heating and stretching of the bundle while fusing the fibers together to form a bundle which matches the diameter of the double clad fiber. This should be done by fusing the fibers together so that any gaps or discontinuities in between the fused fibers are avoided. A common method to achieve this is to apply tensile force to the twisted or pulled portion of the bundle after which the bundle is heated and stretched so that the fibers melt together (U.S. Pat. Nos. 4,291,940, 5,864,644 and 6,434,302). However, using these approaches the making of the high power fused bundles tolerating output powers in excess of hundreds of watts is difficult because even a few micrometer variations in the diameter of the circular fibers being fused together causes the formation of a gap in between the fibers. These methods have been improved by the use of a precursor material (U.S. Pat. No. 6,397,636) or manufacturing a special photonic fiber (U.S. Pat. No. 6,778,562) to minimize the appearance of the gaps in between the fiber. Both of these approaches may reduce the risk of having any gaps or discontinuities in between the fused fibers but one is still left with the problem of careful control of the signal fiber core size variations in the melting and above all stretching of the bundle. These core size variations induce losses to signal and can also excite higher order modes therefore degrading the beam quality of the fiber laser or fiber amplifier.

Another all-fiber coupling architecture introduced in U.S. Pat. No. 6,434,295, which describes a fiber bundle architecture, wherein multiple multimode pumps are coupled into a single multimode-, pump fiber. This pump fiber is further sandwiched in between two double-clad fibers two form a fused coupler section in which all the fibers share a common inner-cladding and two-thirds of the pump light is coupled to the double-clad fiber. The coupled-in pump light travels further to a fiber loop having a typical length corresponding to 10 dB pump absorption. The residual pump light in the pump fiber travels to a second coupling module where another two-thirds of the pump power is absorbed. The approach in this invention is similar to the use of fused fiber bundle in that separate coupler modules are used to couple the pump light into the double-clad fiber. The amplifier fibers are arranged around the pump fiber and heating as well as fiber pulling parameters to form the fused coupling are chosen to ensure good melting among the fiber inner cladding and the silica fiber. Unfortunately, the manufacturing of the couplers is still done separately and is extremely sensitive to any perturbation in the fusing process, which may excite higher order modes and cause extra signal and pump losses. Therefore the use of such couplers in high power fiber lasers/amplifier based on large-mode area fibers creates additional difficulties in maintaining the beam quality close to single-mode behavior.

SUMMARY OF THE INVENTION

The manufacture of the above prior art optical devices such as fiber lasers, couplers and amplifiers require in themselves tapering and stretching measures which cause variations in the cross section of the fibers, especially in the cross sections of the core of single and double cladding fibers. This leads to a degradation of the beam quality produced by the devices. Further, the devices require several manufacturing steps, which make their manufacture laborious and expensive. Also, the devices are difficult to couple with each other and light sources such as laser diodes, especially if many diodes are used (multiple pumping points are installed along the fiber length).

It is an object of this invention to provide a fused all-fiber fused approach for coupling the multimode pump light into the fiber. Such an arrangement is achieved without the tapering and stretching processes that would induce core size variations and, degrade the beam quality of the fiber lasers and amplifiers.

Another object of the invention is to integrate the functionality for injecting the pump light into the double-clad fiber in the fiber manufacturing process in order to minimize any core size variations in the structure and to avoid the manufacturing of separate pump couplers.

A further object of this invention is to allow the pumping of the fiber gain media with multiple discrete fiber-coupled laser diodes in a distributed pumping architecture (multiple pumping points along the fiber length).

The above mentioned problems have now been solved by a bundle containing optical fibers, which is essentially characterized in that at least two of the optical fibers are attached to each other lengthwise by means of at least one longitudinal bridging element which is workable and/or removable in order to detach at least two fibers from each other. This new type of microstructured fiber has many advantages.

By optical fiber bundle is here meant any fiber bundle, which is able to receive an optical signal, amplifying it, and/or modifying it and/or transmitting it further. By optical fiber is meant both a normal fiber, which transmits an optical signal as well as a precursor or semi-manufactured product thereof. Thus, in addition to conventionally meant fiber bundles, also bundles of glass rods and tubes may according to the claimed invention be provided with a workable and/or removable bridging element and optionally subjected to its at least partial removal followed by stretching into the conventionally meant fiber bundle. By "attached to each other lengthwise" is meant that the optical fibers are attached to each other along their whole length or only along a section of their whole length.

By "workable and/or removable" is meant, firstly, that the material of the bridging element is workable and/or removable by a working method. Secondly, the term means that the bridging element is so built, arranged and/or of such material that it is available to a working and/or removing action. This can e.g. mean that there are slits formed between the surrounding fibers through which the bridging element can be worked externally. It can also mean that there is a hole in the bridging element through which it can be worked internally. Naturally a combination of said internal and external availability can be the case. Examples of bridging elements are described in the detailed description of the invention below. By working is meant any action which is directed to, and changes the bridging element or any material uniting the bridging element and the optical fibers. In practice, it may mean machining by physical means such as a laser or by mechanical means such as a blade made of hard material. It may also mean working by chemical means such as etching, leaching or dissolution.

By removing one or more sections of the removable longitudinal bridging element, the optical fibers are in those sections freed from each other and can be used for optical coupling, which may take place at the end and/or in the middle of the fiber bundle. Thus, the instant invention allows the pumping of a fiber laser from a single point with pump powers exceeding 1 kW, as well as dividing this pump power into multiple points and distributing it along the whole fiber laser length without having any additional signal splices along the way. In the structure, the fibers are attached to each other by the bridging element to form a solid all-fused fiber structure.

In the present invention, both the optical fiber and its coupling means are manufactured together in a highly simplified and economic way. This integrated manufacturing of e.g. an active fiber and its pump coupler is about 20% cheaper than separate manufacturing. Furthermore, unwanted variations in the mechanical and optical properties of such a product can be avoided.

In the following, the invention is described more closely by examples and the following figures in which:

FIG. 1 (Prior Art) (a) describes V-groove side pumping, (b) describes angle polished side coupling.

DETAILED DESCRIPTION OF THE INVENTION

Preferably, the optical fibers of the bundle are attached to each other exclusively by means of the bridging element. Then, when removing (etching, melting, cutting, etc.) the bridging element, the loosening of the optical fibers for further coupling becomes easy. It is advantageous if the fibers are attached at a distance from each other exposing the bridging element to said working. This is especially the case when the working of the bridging element in order to release the fibers is carried out from the outside (in contrast to internal working eg. by etching through a hole in the bridging element).

According to an embodiment of the invention, the bridging element consists of a material, which has essentially the same refractive index as the material of the outer layer of the fibers. Preferably, the bridging element is made of the same material as the outer layer of the fibers. This means that the bridging element not only functions as attaching means between the fibers, but also is optically active and helps to guide the light. Usually, it helps to spread the light, thereby e.g. increasing the mode mixing of pump light and enhancing the absorption of pump light into the active fiber. Typically, the material of the bridging element is a light transmitting material such as silica glass or material, which is more easily workable and/or removable than the material of the optical fibers. Preferably, the material is silica glass doped with a material, such as phosphorous, the silica glass of the bridging element being doped thus to make it workable/removable. In order to ensure unhindered light transmission through the bridging element, it is advantageously attached to at least one of the fibers by fusing. Then, no boundary layer prevents the pump radiation from spreading through the bridging element and being absorbed into the laser.

The bridging element is according to the invention so constructed and attached that it is workable and/or removable in a technically acceptable manner. It can be attached to the fibers in a normal way by fusing. In order to attach the fibers and the bridging element in an ordered manner, which allows working of the bridging element, attachment by male-female coupling is advantageous. Most preferably, the coupling takes place by engaging a number of alternating ridges and grooves in the bridging element and fibers in question. The ridges and grooves may be accomplished e.g. by sawing. After male-female coupling, the bridging element and the fibers may advantageously be fused together in order to accomplish an optically homogeneous joint.

In one embodiment of the invention, the bridging element is a separate element to which said at least two fibers of the bundle are attached. Preferably, it is a longitudinal element having a cavity or hole, which can be subjected to internal working through said capillary. Such an element has two advantages. Firstly, the cavity or hole of a not removed portion thereof may be filled with a functional substance, which modifies the properties, especially the optical properties, of the bundle. One such substance is an optical stress inducing material. Secondly, in order to move at least a portion thereof, an etching substance may be sucked or pressed into the cavity or hole, which etches away the portion and releases the fibers.

For the last mentioned purpose, it is advantageous to have thin walls. Therefore, the wall of the bridging element having a cavity or hole has a smaller cross-sectional area than the fibers. Most preferably, the bridging element is a one-hole capillary. The capillary differs from prior art multicapillary photonic fibers, the capillaries of which are closed and/or so thin that an introduction of functional substances is technically impossible. Preferably, the diameter of the hole is from 20 to 200 μm.

According to another embodiment of the invention, the longitudinal bridging element is a projection protruding from and running along one of the fibers and being attached to the other of the fibers. When such a projection is attached to another fiber by fusing, it unites the fibers. The projection can then be removed e.g. by sawing or laser welding, see below, thereby releasing the fibers from each other. Preferably, the projection engages the fiber along which it runs to another fiber by said male-female coupling. Most preferably, the engagement takes place by male-female coupling followed by fusion.

According to one embodiment of the invention, the bridging element is a sacrificial layer, which typically surrounds the optical fiber. This cladding material is preferably a silica glass doped with a material, such as phosphorous, that increases the wet etching speed. The optical fibers are joined together via this sacrificial glass layer. Fibers are attached to said bridging element in such a manner that there are slits in the coating material formed between the surrounding fibers through which the sacrificial layer can be worked externally. The sacrificial layer can then be removed by wet or dry etching, thereby releasing the fibers from each other. Preferably, the sacrificial layer engages the fiber along which it runs to another fiber by said male-female coupling. Most preferably, the engagement takes place by male-female coupling followed by fusion.

In the invention, the number of bridging elements can vary. Although emphasis has been laid on constructions involving only one bridging element holding together many optical fibers, see below, the scope of protection also extends to bundles having more than one bridging element. See e.g. FIG. 7, which shows the use of two bridging elements.

It is preferable if most of the bundle length comprises an outer cladding surrounding the fibers and bridging element comprising said light transmitting material. The cladding most preferably consists of a material having a lower refractive index than the light transmitting material.

In one alternative of the invention, the fibers and the bridging element are arranged in a geometry allowing bending only in a limited number of directions defined by the geometry. Preferably the fibers of the bundle are arranged in a geometry having a significantly larger width in one direction than in other directions, thereby allowing bending only about the axis of said one direction.

The optical fibers of the claimed bundle can be of any type and number, depending on the intended application. Preferably, the optical fibers are selected from single cladding fibers with a core of higher refractive index than said light transmitting material and a cladding of said light transmitting material, and multimode fibers consisting essentially of said light transmitting material. Typically, the single cladding fibers are signal fibers or their precursors and the multimode fibers are pump fibers or their precursors. By precursor is here meant that they may be undrawn rods and/or longitudinal elements which only upon coating with the above-mentioned outer cladding and/or drawing form working signal or pump fiber structures. However, signal fibers may also have multiple cladding layers if that is desired for example to improve the fiber properties. Signal fibers also have a core (13) where the signal light travels. The core 13 of the fiber 12 can be doped with active atoms, such as erbium (Er), neodymium (Nd) or ytterbium (Yb), thulium (Th) or other rare earth atoms to provide gain in the laser or amplifier by optical excitation or pumping of those atoms. Typically, pump fibers don't have cladding layers. However, even in pump fibers, the use of cladding layers in order to improve the properties of fiber structure is in some cases beneficial.

The bundle in the device according to the invention typically has a structure in which one of the single cladding fibers and one of the multimode fibers are adjacently attached to each other via the bridging element. According to one main embodiment, the single cladding fiber, the bridging element and the multimode fiber are, in said order, arranged in a parallel-aligned conformation and surrounded by the outer cladding. Then, the elements may have different cross-sectional areas, e.g. the multimode fiber may have a larger cross-sectional area than the single cladding fiber and the bridging element, forming a so called keyhole profile. A further structure is obtained if one of the single cladding fibers is parallel-aligned with, in outwards order, two bridging elements and two of the multimode fibers, and surrounded by the outer cladding (see the examples below). One bridging element may be attached to three of the multimode fibers and one of the single cladding fibers and surrounded by the outer cladding. This construction may be arranged into a structure having a four clover-formed cross-section.

One important advantage when using the bridging element according to the invention is that it can easily be removed to detach the optical fibers. Thus, the claimed bundle may have a section consisting of said at least two of the optical fibers which are detached from each other. The detachment is carried out by at least partly working and/or removing the corresponding length portion of the bridging element between the fibers. Typically, said portion of the bridging element has been removed by a method selected from wet etching, dry etching, $CO_2$, UV, ultra fast laser micromachining as well as ion milling or a combination of said methods.

In one embodiment of the invention, the bundle portion constitutes an end section having loose optical fibers. Typically, after detaching the optical fibers from each other at the end section of the bundle, the fibers are (again) individually covered with essentially the same material as that of said outer cladding. If the other end of the bundle is tapered, the bundle may form a typical coupler device. If the other end of the bundle consists of optical fibers, which are also detached from each other, the bundle may form a typical fiber amplifier device.

The invention relates to a process for the preparation of a bundle containing optical fibers. In the invention, a bundle is prepared by attaching at least two of its optical fibers to each other lengthwise by means of at least one longitudinal bridging element, which is workable and/or removable in order to detach the two fibers from each other. The details of this process are disclosed above in connection to the bundle and below in claims 41 to 80.

The main advantages of the invention are as follows:
Provides mechanically reliable and stable coupling from the laser waveguide to pump waveguide when compared to end pumping schemes
The fiber length can be defined after drawing
The pump fiber geometry and the active fiber geometry can be chosen independently
The fiber geometries allowing the bending of the final fiber only in a limited number of directions are accomplished Excellent and economically efficient optical coupling from pump waveguide to signal waveguide Improved M²-value and beam parameter product Efficient transfer of energy from the pump light in to the doped core due to anti-circular geometry of the pump cladding which force the light rays to interface with the core Less operational steps required when manufacturing laser devices Freedom to operate with several pumping schemes.

This invention allows the pumping of the fiber laser from single point with the pump powers in excess of kW as well as dividing the pump power into multiple points and distributing the pump power along the whole fiber laser length without having any additional signal splices along the way. In the structure the signal fiber(s) and pump fiber(s) are fused together via a bridging element (typically capillary tube) to form a solid all-fused inner cladding structure where the pump light propagates freely between the signal and pump fiber and provides pump light for the active core element. Fibers can be detached from each other by removing the capillary tube from between them for example by etching or by laser micromachining ($CO_2$, excimer or ultrafast lasers) as well as ion milling. All the fibers can then be processed by standard fusion splicing techniques to splice multimode fibers or fused multimode fiber bundles to the pump fibers. Also the signal fiber having a doped core can be spliced to input and output signal fiber. In the detachment process the doped core does not experience any deformation of the core diameter and hence the splice between the input and output signal fiber can be matched well without the excitation of the undesirable higher order modes.

Figure 5:
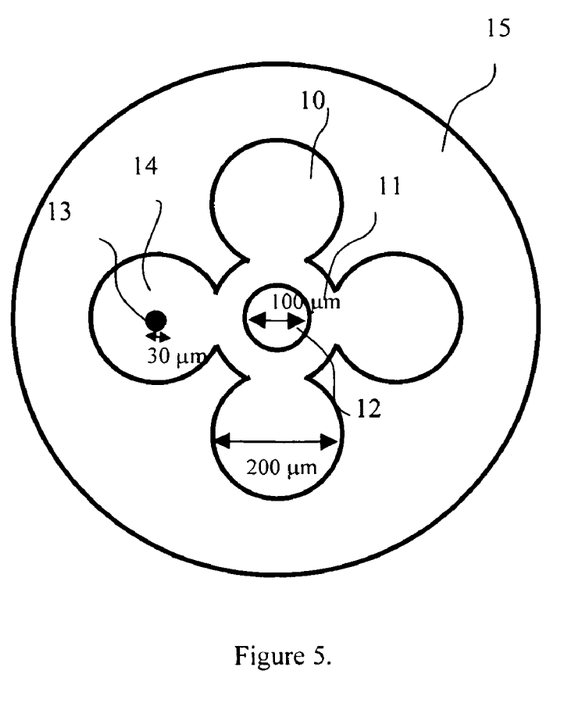
FIG. 5 describes a clover-shaped embodiment of the claimed bundle.
Figure 6:
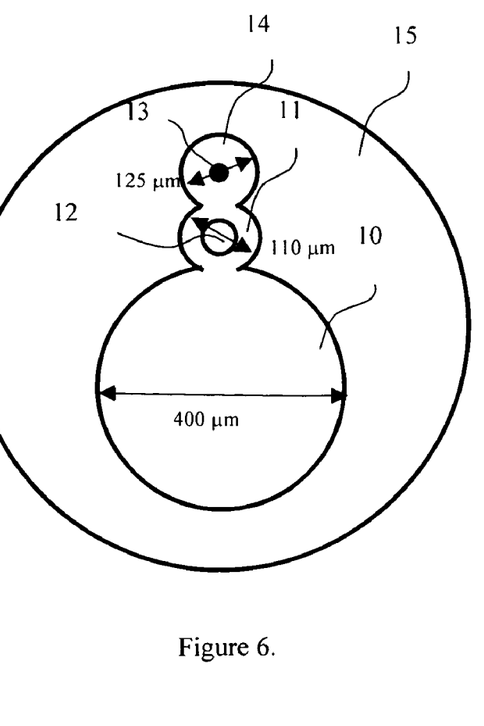
FIG. 6 describes a keyhole-shaped embodiment of the claimed bundle.
Figure 7:
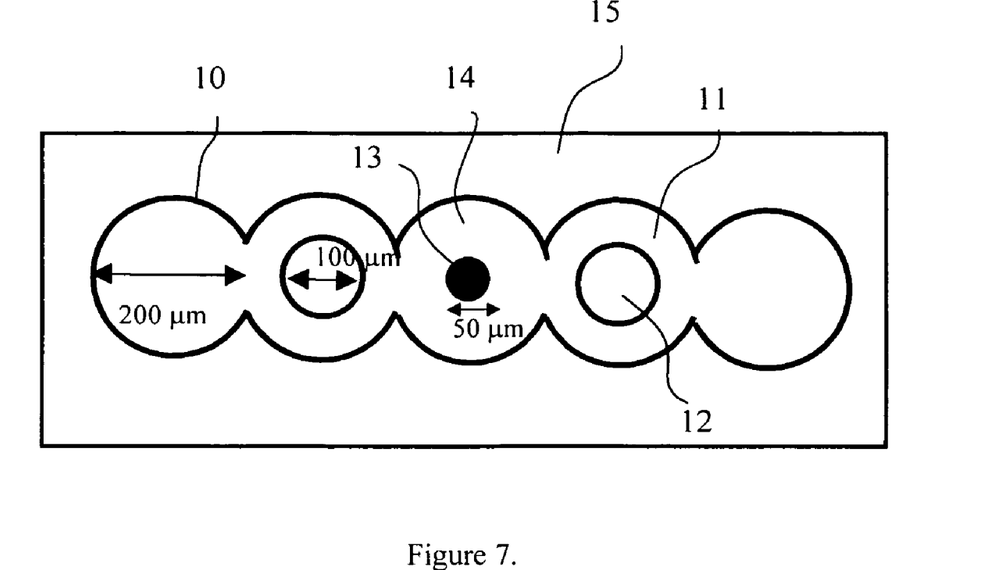
FIG. 7 describes a double keyhole-shaped embodiment of the bundle.

The purpose of the bridging elements in the structure is three-folded. Firstly to fuse the active fiber elements and pump fiber(s) together to form a solid all-fused inner cladding structure where the pump light propagates freely between the signal and pump fiber and provides pump light for the active core element as shown in FIGS. 5, 6, and 7. Secondly the bridging element acts as a separating element for injecting pump light as it can locally removed for example by etching or by laser cutting leaving the fiber from the composite fiber end free for splicing signal and pump fibers. Thirdly, it brings additional functionality to the double-clad device. For example in case of a capillary tube acting as a bridging element the air-hole in the middle of the capillary tube improves the mode mixing of the pump light within the structure therefore enhancing the absorption of the pump light in the active fiber. Additionally, the air-hole in the structure can be filled with a suitable material for example to increase the birefringence of the fiber.

Figure 8:
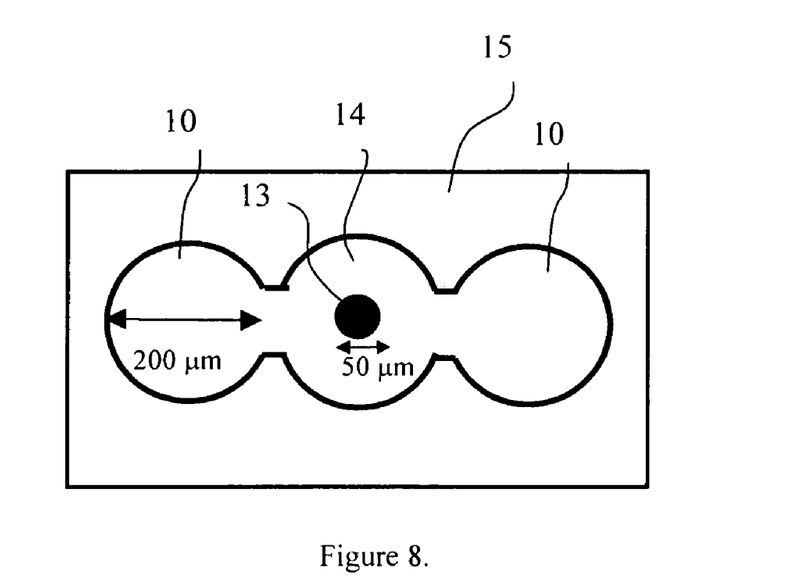
FIG. 8 describes a linear-aligned and compact embodiment of the bundle.
Figure 9:
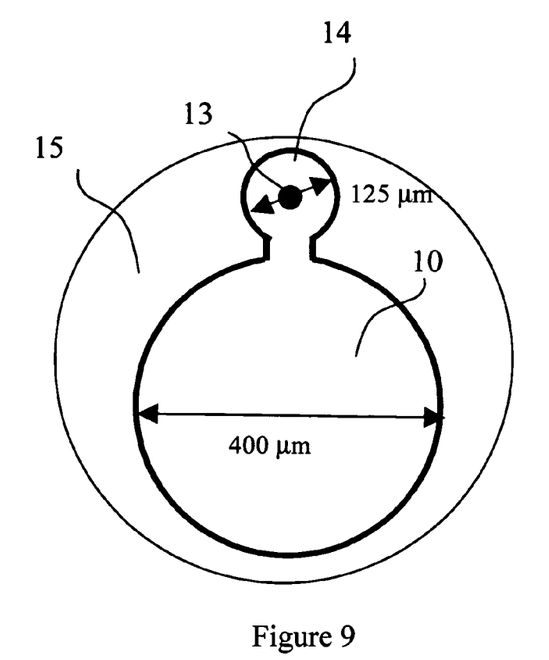
FIG. 9 describes another compact embodiment of the bundle.
Figure 10:
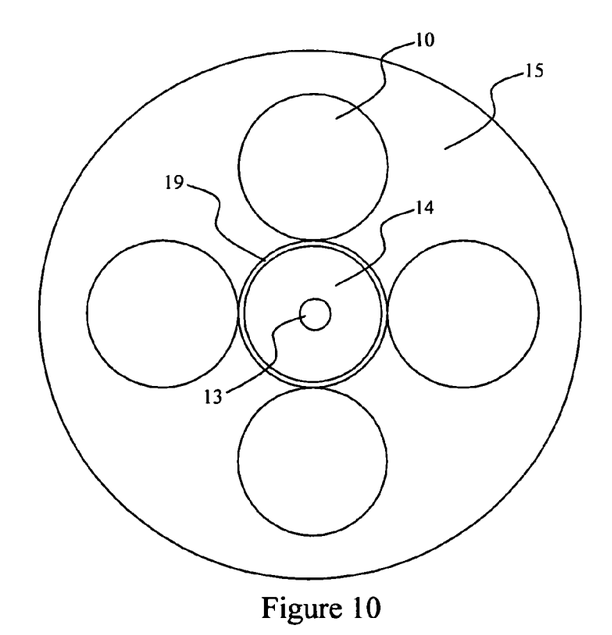
FIG. 10 describes a clover-shaped embodiment of the claimed bundle where the bridging element is a sacrificial cladding layer on an optical fiber.

The number of each element in the structure can vary depending on the different needs required by the applications. Structure can consist of one or more pump fibers as well as multiple signal fibers. Without the active core element the fused bundle acts as a pure pump coupler. Also the number of capillary tubes fusing the active and pumping elements together can vary. The fusing of the fibers can also be done without the use of capillary tubes as shown in FIGS. 8, 9 and 10. In the cases of FIGS. 8 and 9, however, separate detachment points (perpendicular grooves on the fiber surface locating along the fiber length) have to be done prior to the drawing of the microstructured fiber. Detachment can also be done by splitting the microstructured fiber at the fused joint e.g. by using a $CO_2$— or excimer laser, ion milling or as in case of FIG. 10 by wet or dry etching.

Microstructured Fiber

The microstructured fiber, which is used in making the double-clad fiber devices, consists of three elements: the signal fiber(s) 14 with an active core-element(s) 13, the capillary tube 11 having an air hole 12 and one or more pump elements 10 shown in FIG. 5. These elements are fused together so that a structure, wherein the signal fiber(s) and pump fiber(s) together form a solid all-fused inner cladding structure where the pump light propagates freely between the signal and pump fiber and provides pump light for the active core element.

Capillary Tube as Bridging Element

The idea behind the capillary is that the capillary part 11 can be etched away from the fiber ends by feeding for example hydrofluoric acid (HF, room temperature) or sulphuric hexa-fluoride ($SF_6$, elevated temperature, 800° C.) into the air hole 12.

The etching process using HF is the following:

$$SiO_2 + 4HF \rightarrow SiF_4 + 2H_2O$$

When using 45% HF solution and assuming that 70% of the hydrofluoric acid is consumed the capillary diameter increases about 6%. The HF acid needs to be chanced 12 times in the capillary if the outer diameter is twice the inner diameter. The larger hole diameter decrease the number of the HF changes in the capillary. The etching of the capillary can be done before coating removal and all the glass between the pump and the core-elements can be removed.

Figure 11:
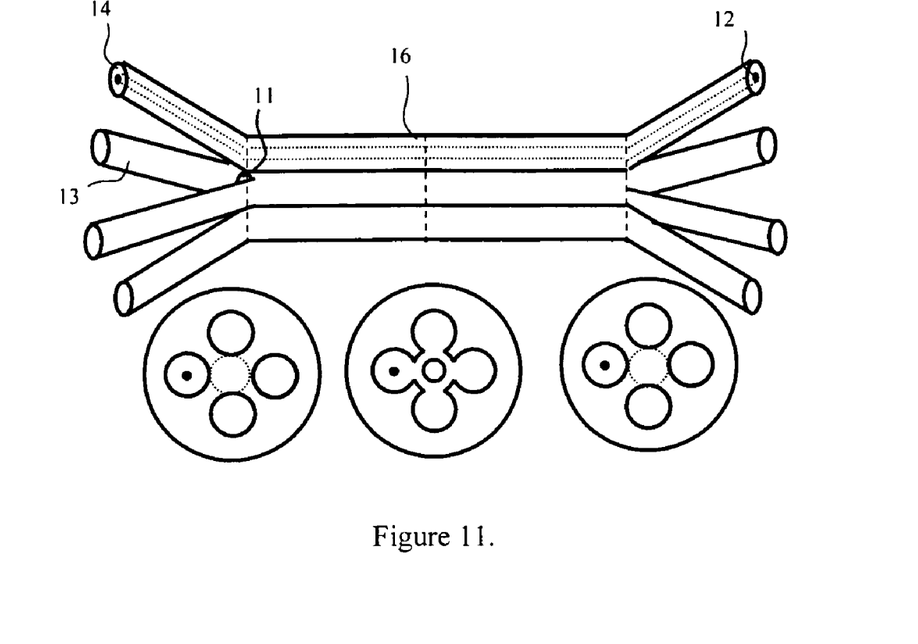
FIG. 11 describes a fiber laser or fiber amplifier bundle of the invention.

This etching will detach the signal fiber 14 with the active core 13 from the pump fiber(s) 10 as shown in FIG. 11. After the etching has been done the free fiber ends 13, 14 can be spliced to fiber coupled pump diodes and to output (and input) signal fiber(s) using the standard splicing techniques. After splicing the exposed fiber parts will be re-coated using the same polymers as were used for fiber coating.

Alternative method to partly separate the fiber elements from the structure is to use laser micromachining methods either to the drawn fiber or to the preform prior to the drawing of the fiber. In the latter case periodic holes are produced directly to the capillary part of the preform. The separation distance in between the holes is determined by the dimensions of the preform and by the desired absorption length in the final fiber. For example for a 10-cm long preform with a fiber geometry shown in FIG. 5 and with a target core size of 30 μm the separation of the holes in the preform is in the range of 1 to 2 mm. The width of the hole is determined by the length of the fiber, which is needed for splicing purposes. Typically this length in the final fiber is 50 cm, which corresponds to about 200 μm long hole in the preform. After the processing of these holes to the preform the fiber is drawn and coated. The double-clad devices can then be made simply by cleaving the double-clad fiber in between the separation points, removing the coating and splicing the signal and pump fibers from the composite fiber end to the signal and pump fibers.

Apart from acting as a separation element capillary tubes or axially extending air-holes in the structure can also bring additional functionality in the double-clad fibers. The glass bridge surrounding the air-hole and fusing all the elements together ensures efficient mode mixing of the pump light in the structure as shown (see the non-circular symmetry in FIGS. 5 and 6). This reduces the number of helical modes in the double-clad fiber and therefore enhances the amount of pump light absorbed by the doped core. Further benefit of the air holes and the flexibility of the geometry within the microstructured fibers is that by arranging the air holes in close proximity to the doped core or by filling the air holes with stress inducing material the birefringence of the fiber can be increased. This polarization maintaining effect can be increased by arranging all the elements in a linear structure which forces the fiber to bend only in two directions as shown in FIG. 7. Air-holes may also be filled with materials which enhance the nonlinearity of the fiber (e.g. poled fiber, Raman enhanced fiber).

Solid Glass Bridging Elements

The microstructured fiber may also be joined together via all-glass bridging elements. In this case a special joining structure is manufactured using standard glass grinding methods as shown in FIG. 4b. This glass joint can be partly separated from the structure by using laser micromachining methods or laser assisted wet etching methods either to the drawn fiber or to the preform prior to the drawing of the fiber. In the latter case periodic holes are produced directly to the glass joint in between the rods in the preform. The separation distance in between the holes is determined by the dimensions of the preform and by the desired absorption length in the final fiber. Fex for a 10-cm long preform with a fiber geometry shown in FIGS. 8 and 9 and with a target core size of 30 μm the separation of the holes in the preform is in the range of 1 to 2 mm. The width of the hole is determined by the length of the fiber, which is needed for splicing purposes. Typically this length in the final fiber is 50 cm, which corresponds to about 200 μm long hole in the preform. After the processing of these holes to the preform the fiber is drawn and coated. The double-clad devices can then be made simply by cleaving the double-clad fiber in between the separation points, removing the coating and splicing the signal and pump fibers from the composite fiber end to the signal and pump fibers.

Sacrificial Cladding Layer as a Bridging Element

The microstructured fiber may also be joined together by a sacrificial cladding layer on an optical fiber acting as a bridging element in the bundle as shown in FIG. 10. In this case the joining of the structures is done by the method shown in FIG. 4c). The optical fiber 14 is surrounded by a sacrificial cladding layer 19 acting as a bridging element. Preferably, this cladding material is a silica glass doped with a material increasing the wet etch ratio such as phosphorous. On the joining part some grooves are sawn on the surfaces of these round objects along their length. The grooves on the bridging element preferably do not extend over the sacrificial cladding layer. Pump elements 10 are attached to the bridging element in such a manner that there are slits formed in the coating material between the surrounding fibers through which the sacrificial layer acting as bridging element can be worked externally. The detachment can be carried out by at least partly working and/or removing the corresponding length portion of sacrificial layer of the optical fiber acting as a bridging element between the fibers. Typically, said portion of the bridging element has been removed by a method selected from wet etching and dry etching.

How the Fiber is Produced

Figure 4:
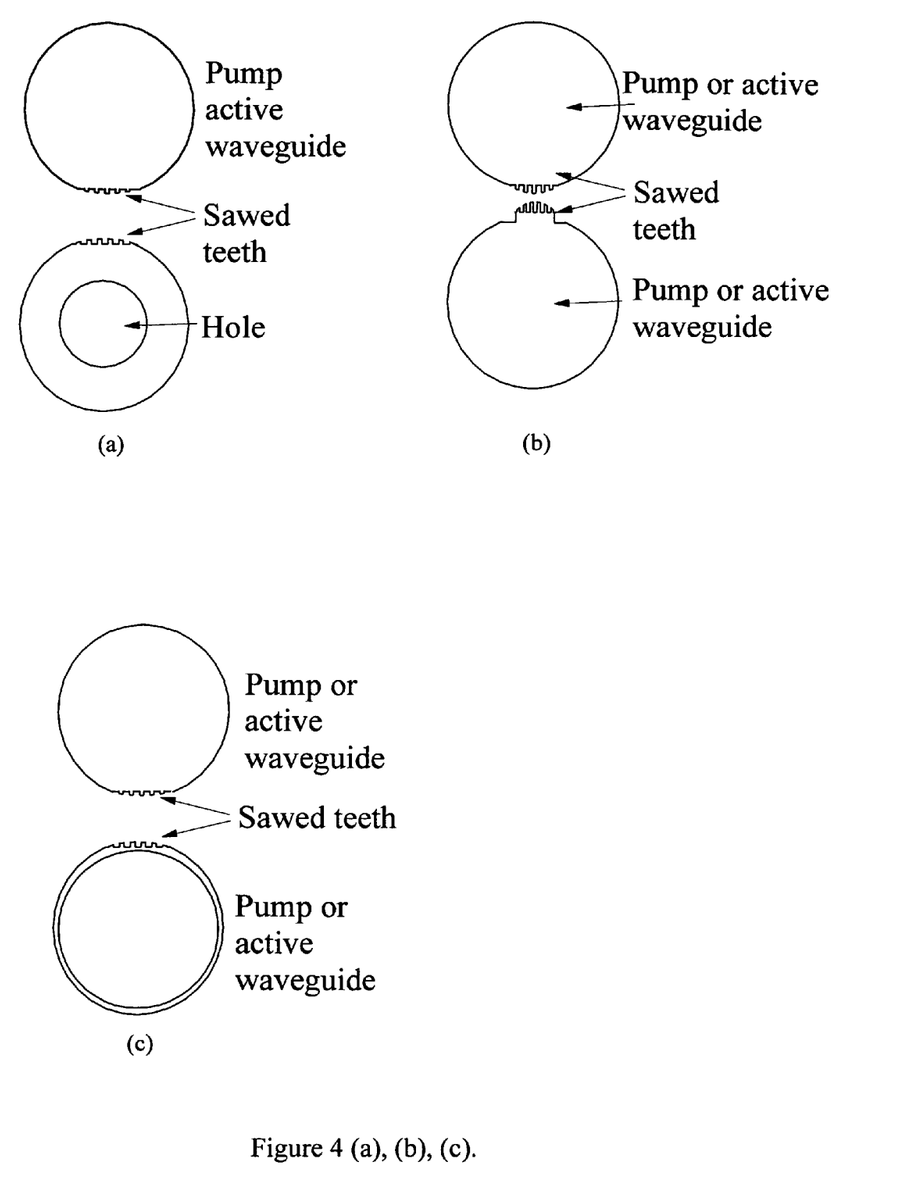
FIG. 4 describes a) the preforms before joining by utilizing capillary tubes, b) all-glass joints as bridging elements, and c) a sacrificial cladding layer acting as a bridging element.

All the preform elements are first made using the common techniques and they are in the form of symmetrically shaped (round, rectangular, hexagonal, octagonal) tubes or rods. Typical shape of the rods and tubes is round. On the joining part some grooves are sawn on the surfaces of these round objects along their length. The resulting cross-section is shown in FIG. 4. After that the said elements are fixed together so, that the 'teeths' of the preform 1 fit to the grooves of the preform 2. Capillary tubes (4a), all-glass joints (4b) and optical fibers can be utilized as bridging elements. After that the preforms are fused together (with flame or with oven) and the microstructured fiber is drawn.

EXAMPLES

Example 1

In one embodiment of the invention, the Key Hole fiber structure (clover fiber) is established, FIG. 5. The fiber structure consists of Pump fiber 10, capillary tube 11 with an air hole 12 in the middle of it, signal fiber 14 with an active core 13, low index polymer coating 15.

Example 2

In a second example, a Key Hole structure type 2 is created, FIG. 6. The fiber structure consists of Pump fiber 10, capillary tube 11 with an air hole 12 in the middle of it, signal fiber 14 with an active core 13, low index polymer coating 15.

Example 3

Fiber with Forced Bending Direction

The compound fiber of the present invention allows for a number of different configurations as far as the size, shape, number and positions of the each of its elements are concerned. Some of these configurations can be used to enhance the properties of the fiber lasers or amplifiers built from such fibers. For instance, it is evident that the fiber geometry of FIG. 7 makes the bending of the fiber to be very difficult along one direction and very easy along the perpendicular direction. This property can be utilized in situations where the direction of fiber bending is important for controlling the modal properties of the active fiber. Thus, the active fiber geometry and orientation with respect to the other elements can be fixed already in the preform manufacturing stage and the spatial relationships will remain the same during and after the fiber drawing process. This property of the fiber of the present invention is of utmost importance especially in the case of multi-mode large mode area active fiber geometries and index profiles where modal resonances or modal leakage out of the core can be controlled by appropriate amount and direction of bending of the fiber. The Key Hole fiber structure 3 consisting of pump fiber 10, capillary tube 11 with an air hole 12 in the middle of it, signal fiber 14 with an active core 13, low index polymer coating 15 is described in FIG. 7.

Example 4

In a further embodiment of this invention, the solid key fiber structure 1 is established. The fiber structure is described in FIG. 8 consisting of pump fibers 10, signal fiber 14 with an active core 13, low index polymer coating 15.

Example 5

This embodiment of the invention encloses the solid key structure 2. The fiber structure is described in FIG. 9 consisting of pump fibers 10, signal fiber 14 with an active core 13, low index polymer coating 15.

Example 6

This embodiment of the invention encloses the clover fiber structure utilizing a sacrificial cladding layer surrounding an optical fiber as a bridging element. The fiber structure is described in FIG. 10 consisting of pump fibers 10, optical fiber 14 with an active core 13, low index polymer coating 15 and a sacrificial cladding layer surrounding the optical fiber 14 acting as a bridging element 19.

Example 7

This embodiment of the invention describes the Key Hole fiber structure in a fiber laser/fiber amplifier configuration, after the capillary tube 11 is removed from the structure and signal fiber 14 with an active core 13 and pump fibers 10 are available for splicing. Fibers are fused together along the length 16. The fiber structure in question is described in FIG. 11.

Example 8

Figure 12:
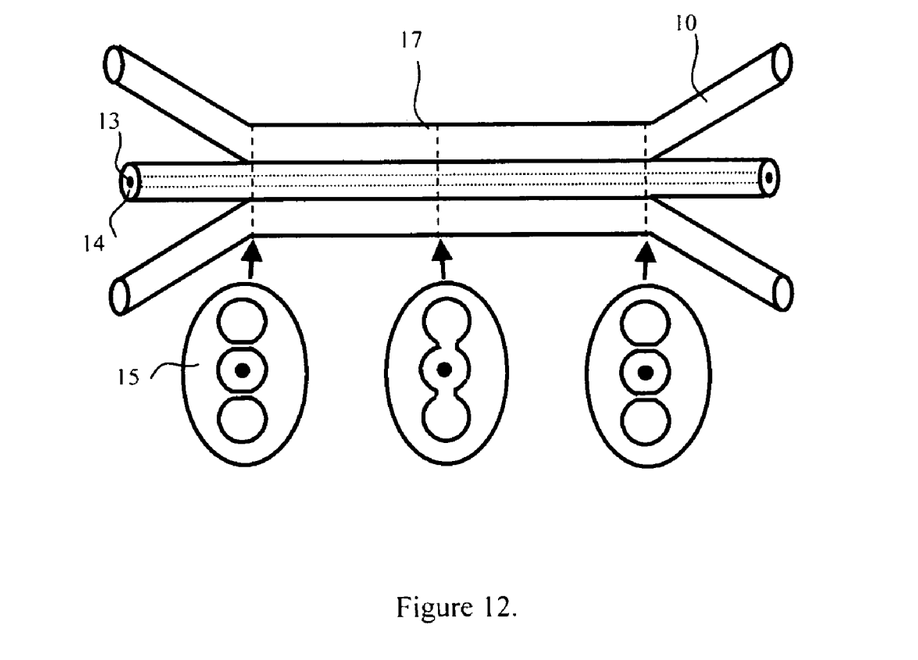
FIG. 12 describes another fiber laser or fiber amplifier bundle if the invention.

This embodiment of the invention describes the key fiber structure 1 in a fiber laser/fiber amplifier configuration, after the coating is removed surrounding the pump fibers 10 and the signal fiber 14 with an active core 13 at the location where the fibers are split apart from each other. After the separation the signal fiber 14 and pump fibers 10 are available for splicing. Fibers are fused together along the length 17. The fiber structure in question is described in FIG. 12.

Example 9

Figure 13:
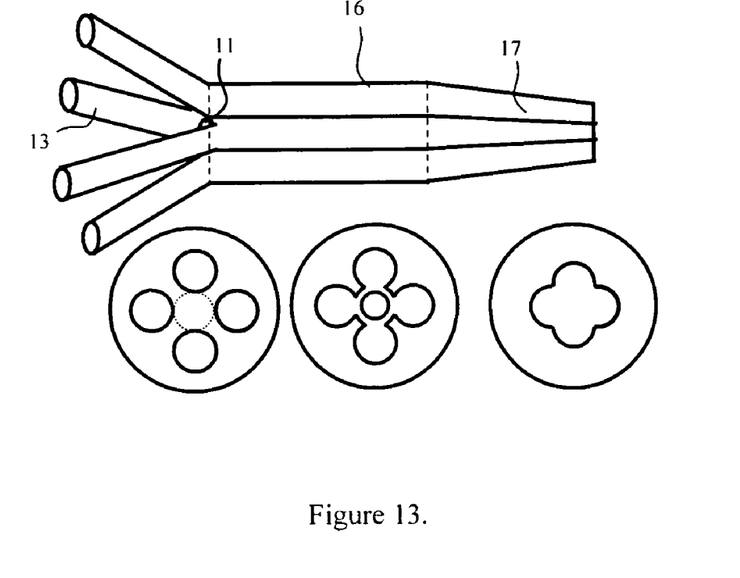
FIG. 13 describes a pump coupler according to the invention.

In a still another embodiment of the invention, the Key Hole fiber structure 1 forms an pump coupler configuration, after the capillary tube 11 is removed and the fused fiber bundle is heated and stretched. The loose pump fibers 10 and the tapered output end of the fused bundle are available for splicing to fiber coupled pump diodes and to the double clad fiber. Fibers are fused together along the length 16. The fiber structure in question is described in FIG. 13.

Example 10

Figure 14:
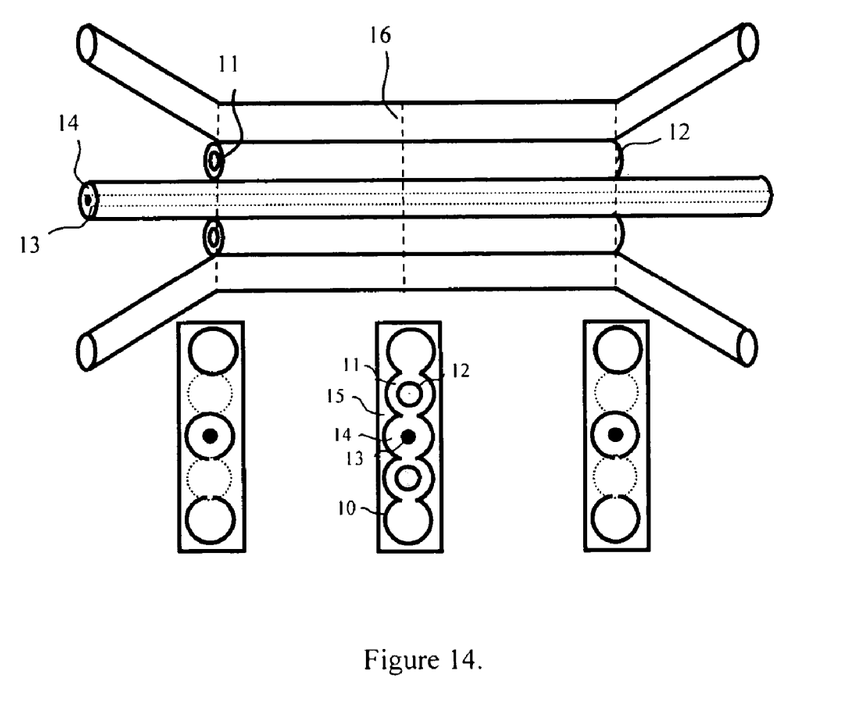
FIG. 14 describes a further linear-aligned fiber laser or fiber amplifier of the invention.

The Key Hole fiber structure 1 can be established in a fiber laser/fiber amplifier configuration, after the capillary tube 11 is removed from the structure and signal fiber 14 with an active core 13 and pump fibers 10 are available for splicing. Fibers are fused together along the length 16. The fiber structure in question is described in FIG. 14.

The invention claimed is:

1. A bundle, comprising:
   two optical fibers; and
   a bridging element comprising silica glass which has essentially a same refractive index as a material of an outer layer of the two optical fibers and being capable of guiding a light from one optical fiber of a group of the two optical fibers to another optical fiber of the group of the two optical fibers, the bridging element attaching the two optical fibers lengthwise to each other and enabling an optical coupling between the two optical fibers detached partly from each other by being workable and/or removable for detaching the two optical fibers partly from each other.

2. A bundle according to claim 1, wherein the fibers attached to each other by a bridging element are attached to each other exclusively by the bridging element.

3. A bundle according to claim 2, wherein the fibers are attached at a distance from each other thereby exposing the bridging element attaching the fibers to working.

4. A bundle according to claim 1, wherein the silica glass of the bridging element is the same as the material of the outer layers of the fibers and is a light transmitting material.

5. A bundle according to claim 1, wherein the silica glass of the bridging element is more easily workable and/or removable than the material of the optical fibers.

6. A bundle according to claim 1, wherein at least one of the fibers is fused to the bridging element.

7. A bundle according to claim 1, further comprising a male-female couple attaching at least one of the fibers is attached to the bridging element.

8. A bundle according to claim 1, wherein the bridging element is a separate element to which the at least two fibers are attached.

9. A bundle according to claim 8, wherein the bridging element is a longitudinal element having a cavity or hole.

10. A bundle according to claim 9, wherein the longitudinal element is a capillary, whereby the longitudinal element can be subjected to internal working through said capillary.

11. A bundle according to claim 9, wherein the wall of the longitudinal element having a cavity or hole has a smaller cross-sectional area than the fibers.

12. A bundle according to claim 9, wherein the cavity or hole is filled with a functional substance.

13. A bundle according to claim 1, wherein the bridging element is a projection protruding from one of the at least two fibers and being attached to the other of the at least two fibers.

14. A bundle according to claim 1, wherein the bridging element is a cladding layer on one of the optical fibers.

15. A bundle according to claim 14, wherein the cladding of the optical fiber is a sacrificial cladding layer which is workable and or removable in order to detach the fibers from each other.

16. A bundle according to claim 14, wherein the fibers are attached to each other exclusively via a sacrificial layer of an optical fiber.

17. A bundle according to claim 14, wherein the sacrificial layer consists of a material, which has essentially the same refractive index as the material of the outer layer of the fibers and is light transmitting.

18. A bundle according to claim 17, wherein the optical fibers are either single cladding fibers with a core of higher refractive index than the said light transmitting material and a cladding of said light transmitting material, or multimode fibers consisting essentially of said light transmitting material.

19. A bundle according to claim 1, comprising an outer cladding surrounding the fibers and bridging element, said outer cladding consisting of a material having a lower refractive index than the glass of the bridging element.

20. A bundle according to claim 1, wherein the fibers and the bridging element are arranged in a geometry allowing bending only in a limited number of directions defined by the geometry.

21. A bundle according to claim 4, wherein the fibers are selected from single cladding fibers with a core of higher refractive index than said light transmitting material and a cladding of said light transmitting material, and multimode fibers consisting essentially of said light transmitting material.

22. A bundle according to claim 21, wherein the single cladding fibers are signal fibers or their precursors and the multimode fibers are pump fibers or their precursors.

23. A bundle according to claim 21, wherein at least one single cladding fiber and at least one multimode fiber are adjacently attached to each other via the bridging element.

24. A bundle according to claim 23, wherein the single cladding fiber, the bridging element and the multimode fiber are, in said order, arranged in a parallel-aligned conformation and surrounded by the outer cladding.

25. A bundle according to claim 24, wherein the single cladding fiber, the bridging element and the multimode fiber have different cross-sectional areas.

26. A bundle according to claim 25, wherein the multimode fiber has a larger cross-sectional area than the single cladding fiber and the bridging element.

27. A bundle according to claim 23, comprising a single cladding fiber aligned in parallel with, in outwards order, two bridging elements and two of the multimode fibers, and surrounded by the outer cladding.

28. A bundle according to claim 23, comprising one bridging element attached to three multimode fibers and one single cladding fiber and surrounded by the outer cladding.

29. A bundle according to claim 28, comprising three multimode fibers and one single cladding fiber arranged around the bridging element in an arrangement having a four clover shaped cross-section.

30. A bundle according to claim 1, comprising at least one optical fiber detached from the bridging element in a section of the bundle.

31. A bundle according to claim 30, wherein the detachment has been carried out by at least partly working and/or removing a portion of the bridging element between the fibers.

32. A bundle according to claim 31, wherein the portion of the bridging element has been removed by wet etching, dry etching, CO2, UV and ultrafast laser micromachining, or ion milling; or a combination of said methods.

33. A bundle according to claim 30, wherein the bundle section constitutes an end section of detached fibers.

34. A bundle according to claim 33, wherein the detached fibers of the end section are individually covered with essentially the same material as that of said outer cladding.

35. A bundle according to claim 30, wherein at least one further bundle section thereof is tapered.

36. A bundle according to claim 35, wherein the tapered bundle section constitutes a tapered end portion.

37. A bundle according to claim 30, comprising a further bundle section having at least two optical fibers, which are detached from each other.

38. A bundle according to claim 37, wherein said bundle section is an intermediate section and at least one of the optical fibers has been cut to establish optical connection.

39. A bundle according to claim 37, wherein the further bundle section is the other end section of the bundle.

40. A process for the preparation of a bundle containing optical fibers, comprising:
attaching two of the optical fibers of the bundle to each other lengthwise by means of a longitudinal bridging element comprising silica glass which has essentially a same refractive index as a material of an outer layer of the two optical fibers and is workable and/or removable in order to detach the two fibers partly from each other, the bridging element being capable of guiding a light from one optical fiber of a group of the two optical fibers to another optical fiber of the group of the two optical fibers, the bridge element attaching the two optical fibers lengthwise to each other and enabling an optical coupling between the two optical fibers detached partly from each other.

41. A process according to claim 40, wherein the fibers are attached to each other exclusively by means of the bridging element.

42. A process according to claim 41, wherein the fibers are attached at a distance from each other which exposes the bridging element to working.

43. A process according to claim 40, wherein the silica glass of the bridging element is the same as the material of the outer layers of the fibers and is a light transmitting material.

44. A process according to claim 40, wherein the silica glass of the bridging element is more easily workable and/or removable than the material of the optical fibers.

45. A process according to claim 40, wherein at least one of the fibers is fused to the bridging element.

46. A process according to claim 40, wherein the bundle further comprises a male-female couple attaching at least one of the fibers to the bridging element.

47. A process according to claim 40, wherein the bridging element is a separate element to which the at least two fibers are attached.

48. A process according to claim 47, wherein the bridging element is a longitudinal element having a cavity or hole.

49. A process according to claim 48, wherein the longitudinal element is a capillary, which can be subjected to internal working through said capillary.

50. A process according to claim 48 wherein the wall of the longitudinal element having a cavity or hole has a smaller cross-sectional area than the fibers.

51. A process according to claim 48 wherein the cavity or hole is filled with a functional substance.

52. A process according to claim 40, wherein the bridging element is a projection protruding from one of the at least two fibers and being attached to the other of the at least two fibers.

53. A process according to claim 40, wherein the bridging element is a cladding layer on one of the optical fibers.

54. A process according to claim 53, wherein the cladding of the optical fiber is a sacrificial cladding layer which is workable and or removable in order to detach the fibers from each other.

55. A process according to claims 53, wherein the fibers are attached to each other exclusively via the sacrificial layer of the optical fiber.

56. A process according to claim 53, wherein the sacrificial layer consists of material which has essentially the same refractive index as the material of outer layer of the fibers and is light transmitting.

57. A process according to claim 53, wherein the optical fiber is either a single cladding fiber with a core of higher refractive index than the said light transmitting material and a cladding of the said light transmitting material, or a multimode fiber consisting essentially of the said light transmitting material.

58. A process according to claim 40, wherein the bundle comprises an outer cladding surrounding the fibers and bridging element and consisting of a material having a lower refractive index than said light transmitting material.

59. A process according to claim 40, wherein the fibers and the bridging element are arranged in a geometry allowing bending only in a limited number of directions defined by the geometry.

60. A process according to claim 40, wherein the fibers are selected from single cladding fibers with a core of higher refractive index than a light transmitting material and a cladding of said light transmitting material, and multimode fibers consisting essentially of said light transmitting material.

61. A process according to claim 60, wherein the single cladding fibers are signal fibers and the multimode fibers are pump fibers.

62. A process according to claim 60, wherein at least one of the single cladding fibers and/or at least one of the multimode fibers are adjacently attached to each other via the bridging element.

63. A process according to claim 62, wherein the single cladding fiber, the bridging element and the multimode fiber are, in said order, arranged in a parallel-aligned conformation and surrounded by the outer cladding.

64. A process according to claim 63, wherein the single cladding fiber, the bridging element and the multimode fiber have different cross-sectional areas.

65. A process according to claim 64, wherein the multimode fiber has a larger cross-sectional area than the single cladding fiber and the bridging element.

66. A process according to claim 62, wherein one of the single cladding fibers is parallel-aligned with, in outwards order, two bridging elements and two of the multimode fibers, and surrounded by the outer cladding.

67. A process according to claim 62, wherein one bridging element is attached to three of the multimode fibers and one of the single cladding fibers and surrounded by the outer cladding.

68. A process according to claim 67, wherein the three multimode fibers and the one single cladding fiber are arranged around the bridging element in an arrangement having a four clover-formed cross-section.

69. A process according to claim 40, wherein a section of the bundle consists of said at least one optical fiber, which is detached from the bridging element.

70. A process according to claim 69, wherein the detachment has been carried out by at least partly working and/or removing a corresponding length portion of the bridging element between the fibers.

71. A process according to claim 70, wherein the portion of the bridging element has been removed by wet etching, dry etching, $CO_2$, UV and ultrafast laser micromachining, or ion milling or a combination of said methods.

72. A process according to claim 69, wherein the bundle section constitutes an end section of detached fibers.

73. A process according to claim 72, wherein the detached fibers of the end section are individually covered with essentially the same material as that of said outer cladding.

74. A process according to claim 69, wherein at least one further bundle portion thereof is tapered.

75. A process according to claim 74, wherein the tapered bundle portion constitutes a tapered end portion.

76. A process according to claim 69, wherein a further bundle section thereof consists of said at least two of the optical fibers, which are detached from each other.

77. A process according to claim 76, wherein said bundle section is an intermediate section and at least one of the optical fibers has been cut to establish optical connection.

78. A process according to claim 77, wherein the further bundle section is the other end section of the bundle.

79. A bundle according to claim 4, wherein the light transmitting material is silica glass.

80. A bundle according to claim 1, wherein at least one of the fibers is attached to the bridging element by male-female coupling by at least one engaging ridge and groove.

* * * * *